United States Patent
Shaw

[11] 4,011,747
[45] Mar. 15, 1977

[54] METHOD AND APPARATUS FOR ACOUSTIC SCANNING USING WAVES SCATTERED BY AN ACOUSTIC GRATING

[75] Inventor: H. John Shaw, Stanford, Calif.

[73] Assignee: The Board of Trustees of the Leland Stanford University, Stanford, Calif.

[22] Filed: June 20, 1975

[21] Appl. No.: 588,694

[52] U.S. Cl. .............................. 73/67.5 R; 310/8.3; 333/30 R
[51] Int. Cl.² .......................................... H03H 9/26
[58] Field of Search ............. 73/67.5 R, 67.6, 67.7, 73/67.8 R, 67.9, 71.5 U.S.; 310/8.3, 8.7; 340/5 R, 5 MP, 15, 8 L; 333/30 R

[56] References Cited
UNITED STATES PATENTS

| | | | |
|---|---|---|---|
| 2,505,867 | 5/1950 | Meunier | 73/67.6 |
| 3,654,500 | 4/1972 | Claiborne | 310/8.3 |
| 3,687,219 | 8/1972 | Langlois | 73/71.5 US |
| 3,815,409 | 6/1974 | Macovski | 73/67.9 |
| 3,840,824 | 10/1974 | Bertoni et al. | 333/30 R |

OTHER PUBLICATIONS

Humphryes et al., *Electronics Letters*, "Acoustic Bulk Surface Wave Transducer," vol. 5 No. 9, May 1969, pp. 175-176.

*Primary Examiner*—Richard C. Queisser
*Assistant Examiner*—Stephen A. Kreitman
*Attorney, Agent, or Firm*—Flehr, Hohbach, Test, Albritton & Herbert

[57] ABSTRACT

An acoustic scanning apparatus is described having an acoustic grating for scattering waves into a focused beam. Surface acoustic waves are generated by a chirp signal generator and are introduced along one surface of the scanning apparatus. These waves propagate along the surface, are scattered by the acoustic grating and are thereby converted into bulk acoustic waves. The bulk acoustic waves converge into a focused beam inwardly directed at an angle to the surface acoustic waves. The focused beam scans at substantially the same speed as the surface acoustic waves traveling along the surface of the apparatus. The acoustic grating can also be used to convert bulk waves to surface acoustic waves as either a variable chirp rate generator or a variable pulse compression filter.

50 Claims, 10 Drawing Figures

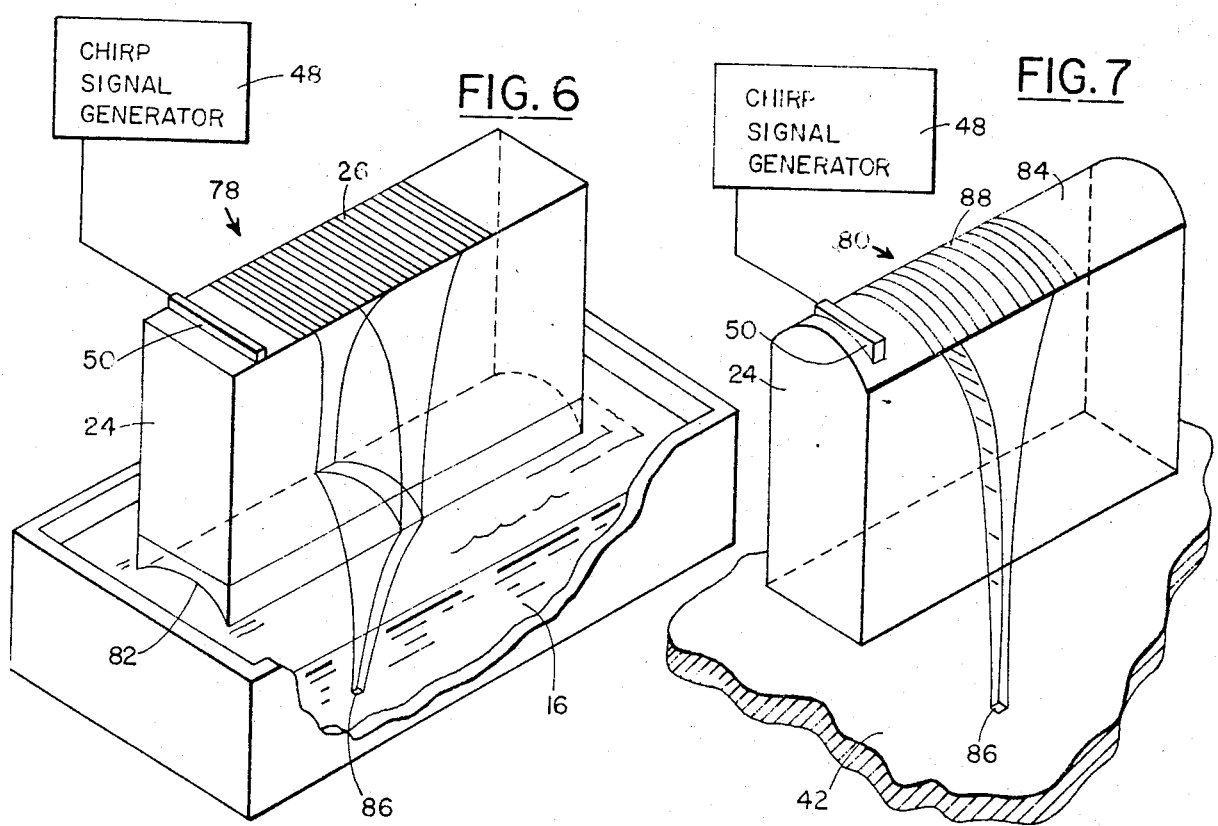
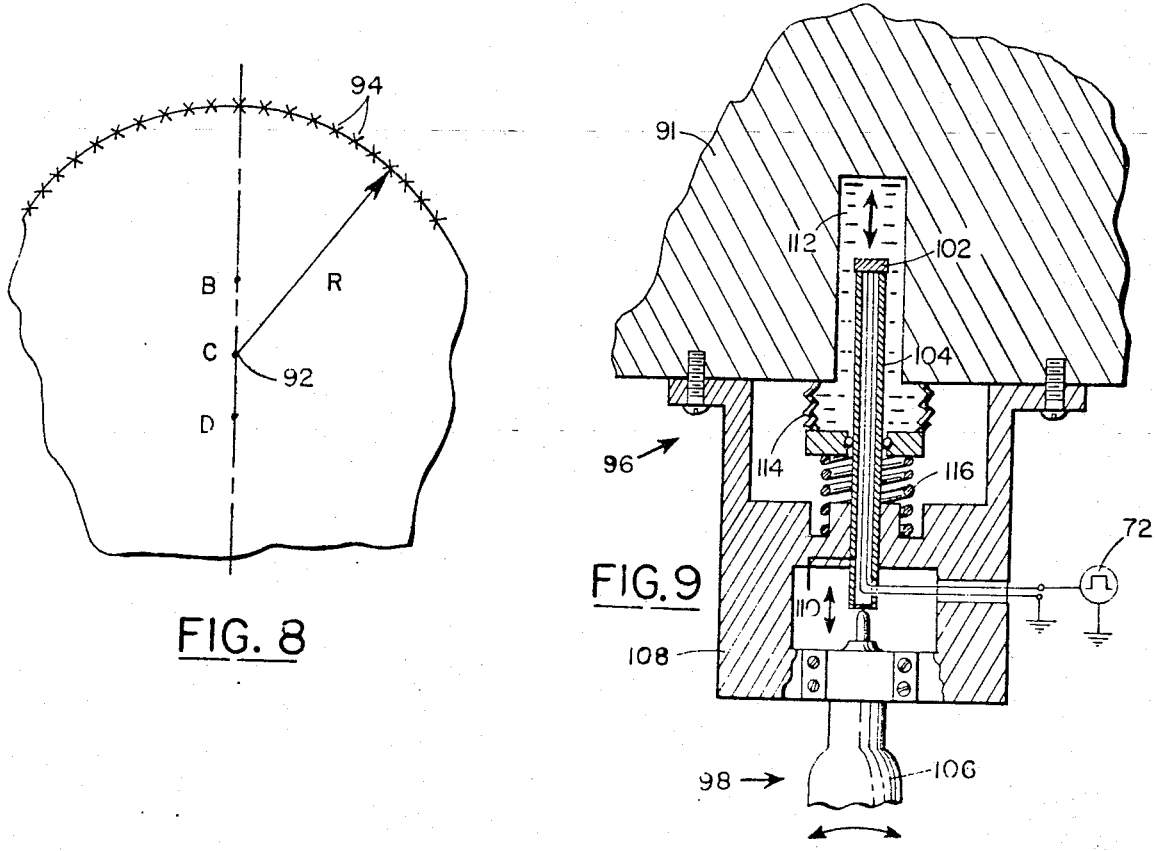

METHOD AND APPARATUS FOR ACOUSTIC SCANNING USING WAVES SCATTERED BY AN ACOUSTIC GRATING

GOVERNMENT CONTRACT

The invention herein described was made in the course of or under a grant with the National Science Foundation.

BACKGROUND OF THE INVENTION

1. Field of the Invention

This invention generally relates to acoustic imaging systems and, more particularly, to focused, acoustic scanning apparatus.

2. Description of the Prior Art

In the past the technology of acoustic scanning has been applied to the non-destructive testing of materials, bio-medical diagnosis and underwater detection. In the field of material testing, acoustic scanning has been used to nondestructively detect such defects as manufacturing flaws, surface cracking and internal material fractures, inclusions, debonded areas and other defects. In the area of bio-medical diagnosis acoustic scanning has been used for such purposes as non-intrusive surveys of internal human organs and biological specimens to produce visual images of these organs or specimens for analysis. Underwater imaging has included scanned sonar systems for investigating submerged objects.

Most of these applications have been carried out using a single ultrasonic transducer mechanically translated across the field of investigation. Recently, however, electronically scanned systems using large arrays of discreet transducers and scanned by a plurality of control circuits have been developed.

In addition, there have also been developed several systems for processing the signals used in acoustic scanning systems. One such system uses a chirp generator that provides an RF tone pulse of constant amplitude whose instantaneous frequency increases linearly with time across the width of the pulse. Since World War II chirp generators have been used extensively in the field of radar and electromagnetic scanning. A second component of such signal processing systems is a pulse compression filter. A pulse compression filter is a frequency sensitive circuit element that retards the leading edge of an input pulse so that the trailing edge of the pulse can catch up and become superimposed on the leading edge at the output of the filter.

Chirp generators and pulse compression filters are further explained in the text, "Radar Signals" by Charles E. Cook and Marvin Bernfeld, Academic Press, New York, 1967.

Heretofore, the major problem in developing acoustic scanning devices has been in fabricating units to difficult tolerances that are rugged and not easily susceptible to damage from mechanical shock. Up until this time acoustic scanning equipment has been either quite fragile and easily broken or required close operating tolerances that were difficult to fabricate and easily disturbed.

Another problem in developing acoustic scanning systems has been the inability to develop designs that can operate effectively throughout the usable acoustic spectrum. Most of the prior systems are operable in the lower frequency portions of the usable acoustic spectrum, usually below 10 MHz.

One further problem with signal processing systems has been that most pulse compression filters are neither tunable nor have the capacity to vary the slope and pulse width of the chirp. Most commercially available generators and pulse compression filter combinations are designed to operate with only predetermined wave forms and must be carefully matched for their intended use.

OBJECTS AND SUMMARY OF THE INVENTION

It is the primary object of the present invention to provide a novel method and apparatus that overcomes the limitations and disadvantages of the prior art.

A further object of the present invention is to provide an extremely simple, acoustic scanning system that is mechanically rugged and can be subjected to mechanical shock.

A further object of the present invention is to provide an acoustic scanning system which is easily fabricated using standard machine shop or standard etching processes.

An additional object of the present invention is to provide an acoustic scanning method that can be designed to operate throughout the usable acoustic frequency spectrum.

A further object of the present invention is to provide an acoustic scanning system whose focal length can be adjusted.

Another object of the present invention is to provide a variable chirp rate generator that permits the chirp rate of the surface acoustic waves generated therefrom to be easily varied.

A further object of the present invention is to provide a variable pulse compresseion filter that can be tuned to accommodate pulses of widely varying slope and pulse width.

These and other objects described herein are achieved by an acoustic scanning apparatus comprising a solid medium and an array of perturbations located along one of its surfaces. When surface acoustic waves are generated by a chirp signal generator and a transducer and propagated along the surface of the scanning apparatus, the surface acoustic waves are scattered by the perturbations and are converted into bulk acoustic waves. The bulk acoustic waves converge into a focused beam inwardly directed at an angle to the surface acoustic waves and scanning at the same speed or comparable speed.

In like manner an acoustic scanning apparatus comprising a solid medium and an array of perturbations located on one of its surfaces converts focused acoustic bulk waves from a source of such waves into electrical output signals. When the bulk waves impinge on the array of perturbations, the array scatters the bulk waves and converts the waves into surface acoustic waves propagating along the surface of the solid medium. A transducer located on the surface converts the surface waves into an output chirp signal. A pulse compression filter connected thereto converts the output chirp signal into electrical signals describing the source.

Additional objects and features of the present invention will appear from the description that follows wherein the preferred embodiments have been set forth in detail in conjunction with the accompanying drawings.

BRIEF DESCRIPTION OF THE DRAWINGS

FIG. 6 is a diagrammatic, perspective view of an acoustic scanning apparatus according to the present invention and further including an acoustic lens for transversely focusing acoustic waves;

FIG. 7 is a diagrammatic, perspective view of an acoustic scanning apparatus according to the present invention and further including a convex array of perturbations for transversely focusing acoustic waves;

FIG. 8 is a pictorial illustration of the wave scattering process occuring in the cylindrical array of perturbations on the scanning apparatus of FIG. 10;

FIG. 9 is a diagrammatic, side elevational view of an apparatus for moving an acoustic transducer within the acoustic scanning apparatus of FIG. 10.

DESCRIPTION OF THE PREFERRED EMBODIMENTS

Figure 1:
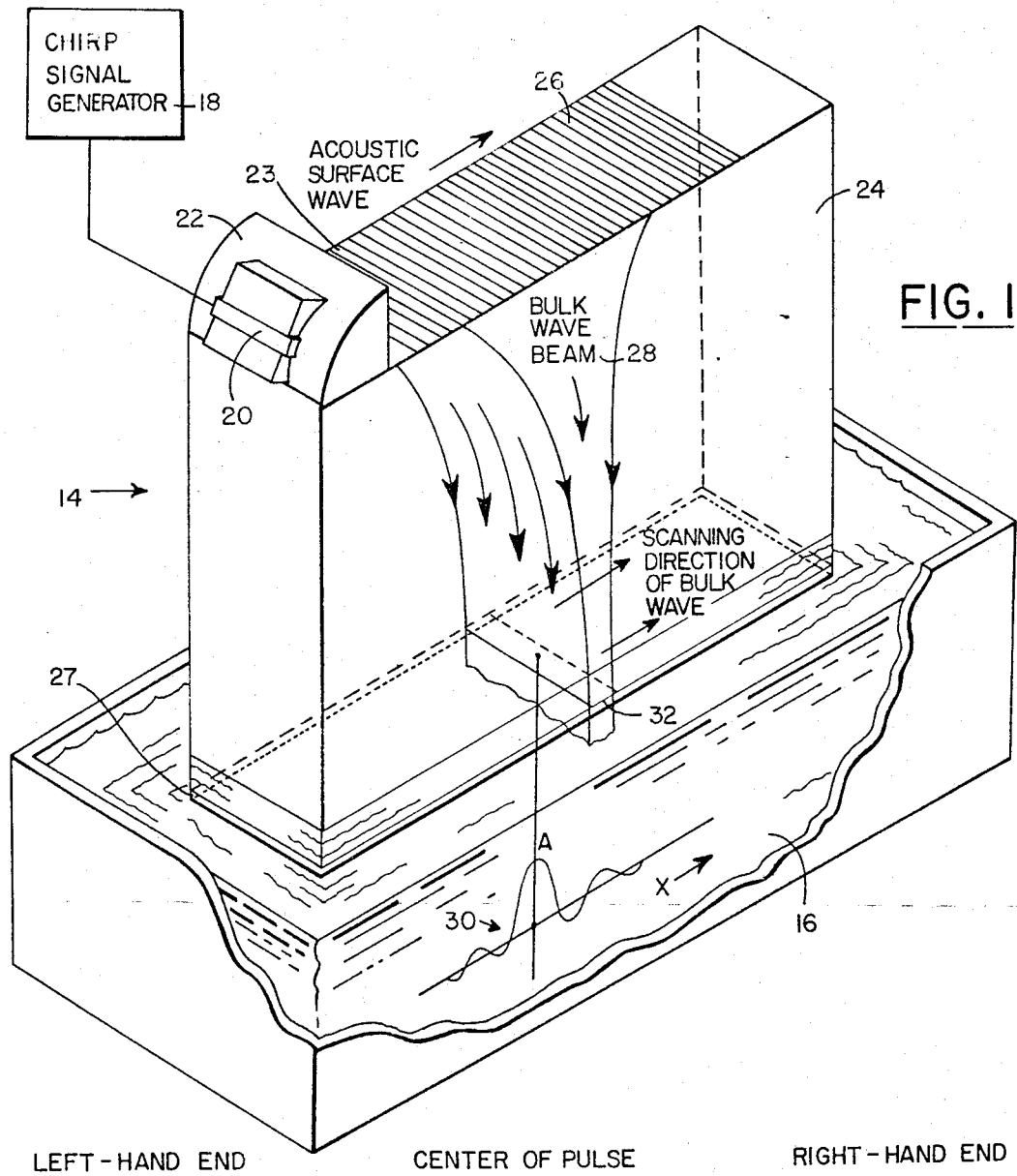
FIG. 1 is a diagrammatic, perspective view of the basic component of an acoustic scanning apparatus according to the present invention.

Referring to FIG. 1, reference numeral 14 generally indicates an acoustic scanning apparatus according to the present invention. The apparatus is partially submerged in a body of water 16 that aids in the transmission of acoustic waves from the apparatus to an external object (not shown) being investigated. Connected to the scanning apparatus is a conventional chirp signal generator 18. The chirp signal generator has an output signal that is passed to a PZT bulk wave transducer 20. The bulk wave transducer is rigidly attached to a conventional, polystyrene wedge transducer 22. The wedge transducer is operatively connected to the scanning apparatus so that the bulk wave transducer 20 and the wedge transducer 22 can direct a bulk wave beam of acoustic waves obliquely onto the upper surface 23 of the apparatus. The beam of bulk waves is thereby converted into acoustic surface waves that propagate along the upper surface 23.

In FIG. 1 the scanning apparatus itself includes a solid medium 24 and array of perturbations 26 located on the upper surface 23 thereof. In the preferred embodiment the solid medium is a rectangular parallelepiped fabricated from aluminum. It should be noted, however, that the solid medium can be fabricated from any metallic, plastic or other material having a low acoustic transmission loss. Also in the preferred embodiment the array of perturbations is an acoustic grating comprising a plurality of uniformly spaced apart, parallel grooves machined into the surface of the solid medium. The grooves have a spacing distance substantially equal to the wavelength of the center frequency of the chirp signals generated by the chirp signal generator 18, or an integral multiple thereof. Various groove cross-sectional shapes are applicable; V-shaped grooves and rectangular shaped grooves are examples.

Attached to the bottom surface of the solid medium 24 in FIG. 1 is an impedence matching transition plate or plates 27 for reducing the insertion loss of the bulk waves passing into the water 16. When the bulk acoustic waves pass from the scanning assembly 14 to another medium and vice versa, there is both coherent partial reflection at the interface and deflection of the waves transmitted across the interface. The principle effects of partial reflection are to increase the background noise of the system. In order to reduce these effects, intervening quarter wave, transition plates could be used. These plates are analogous to the anti-reflection coatings common in optical systems and can be fabricated from materials having an impedence intermediate between the two wave transmitting media.

In one mode of operation, the chirp signal generator 18, FIG. 1 provides an input chirp signal that produces a surface acoustic wave packet having a spatial length that is shorter than the total length of the perturbation array 26. The input chirp signal is passed in turn to the bulk wave transducer 20 and the wedge transducer 22 which develop acoustic surface waves that travel along the top surface 23 of the solid medium 24. When these surface waves interact with the perturbation array 26, the array scatters a portion of the surface waves and thereby converts the surface waves into bulk acoustic waves.

The chirp signal input from the chirp generator 18 causes the bulk waves to converge into a focused beam 28 directed at an angle (which may be 90° as indicated in FIG. 1) to the direction of propagation of the surface acoustic waves. The beam comes to a minimum elongate waist 32 located at a depth and with a width that can be controlled by the spacing of the perturbating array and the characteristics of the chirp pulse input as hereinafter described. In the special case in which the length of the chirp pulse is shorter than the surface acoustic wave transit time along the length of the array, the waist 32 scans in a direction parallel to the perturbation array 26 and at the same velocity as the surface acoustic waves propagate along the top surface 23 of the solid medium 24.

In FIG. 1 reference numeral 30 indicates an amplitude graph describing the amplitude distribution of the converging beam 28 with respect to its width X. The spatial distribution is a function of $$\frac{\sin a X}{a X}$$

for beams of small convergence angle. The boundaries of the bulk wave beam 28 illustrated in FIG. 1 are the zero points of the graph 30.

In one embodiment of the present invention that was actually constructed, the solid medium 24 was fabricated from an aluminum block. The chirp generator 18 provided a chirp pulse signal with a center frequency of one megahertz and the perturbations were fifty V grooves machined into the aluminum block to a depth of twelve mils and with one hundred mil centers.

Although in the preferred embodiment the perturbation array 26, FIG. 1 is machined into the solid medium 24, it is anticipated that other means for scattering the acoustic waves can be used. For acoustic scanning systems operating in the frequency range of 10 megahertz to 500 megahertz, the array can be photoetched onto the solid medium. For frequencies above 500 megahertz, the array can be produced by using scanning electron microscope technology. In addition, the array can be fabricated from a plurality of plated, deposited, or overlaid stripes of other materials positioned along the solid medium 24. It is also anticipated that the spacing distance between the array elements, and also their depths, can be varied in a non-uniform, non-linear manner.

Figure 2:
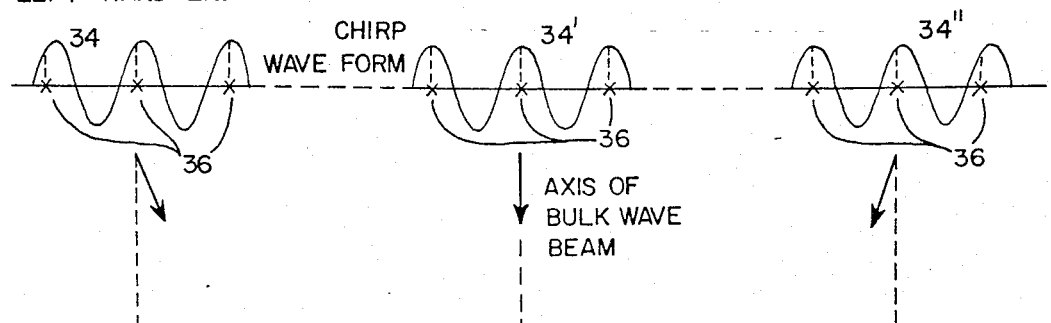
FIG. 2 is a pictorial illustration of the wave scattering and focusing process occuring in the acoustic scanning apparatus of FIG. 1.

In FIG. 2 reference numeral 34 indicates a chirped wave form representing a surface acoustic wave packet. The wave form is superimposed upon a plurality of uniformly spaced apart perturbation elements 36 that comprise a portion of the array 26, FIG. 1. The left hand end of the wave form 34 represents the high frequency end of the wave packet; the middle portion of the wave form 34' represents the center frequency; and the right hand end 34'', the low frequency end.

In FIG. 2 the center frequency portion of the wave form 34' has a wavelength that is equal to the center to center spacing between the adjacent perturbation elements 36 (for the case in which (1) small convergence angles are involved and (2) the bulk wave beam centerline is to make an angle of 90° with respect to the centerline of the array). Thus, in the center portion of the wave 34' the elements 36 are all in phase with the wave and form a broadside sub-array. The resulting bulk wave after scattering has a major lobe directed vertically downward. At the left hand end of the array in FIG. 2 the elements are illuminated by a surface wave having a wavelength that is shorter than the element spacing. Each element has a lagging phase when going from element to element to the right. Thus, the left hand elements form a side-looking sub-array that generates a bulk wave beam directed at an angle to the right of an axis normal to the plane of the array. In a similar manner the elements at the right hand end of the array are illuminated by a surface wave 34'' having a wavelength that is longer than the element spacing. These elements have a phase which leads in going to the right from element to element. Thus, these right hand elements generate a bulk wave beam that is directed backward and to the left of an axis normal to the plane of the array. When the bulk waves from these three locations combine together, the resulting waves tend to be bunched toward the center and focused in the manner illustrated in FIG. 1.

The chirp pulse applied to the system can be either shorter than or longer than the transit time of a surface acoustic wave along the entire length of the array of grooves. In the former case when the beam focus lies within the solid medium 24 or at its interface with a second medium, the spatial pulse compression ratio of the system in FIG. 1 is given by the following equation:

$$\frac{w}{W} = \frac{1}{(\Delta T)(\Delta f)} \qquad \text{Eqn: 1}$$

where:
w = the width of the waist 32

W = the product of the surface wave velocity along the array 26 and the time width of the chirp pulse
$\Delta T$ = the time width of the chirp pulse
$\Delta f$ = the bandwidth of the chirp pulse Equation (1) is derived under the conditions that the maximum angle between the rays in the focused beam and the centerline of the beam is small (paraxial ray approximation), and the medium 24 is acoustically isotropic. The spatial pulse compression ratio is the ratio between the width of the surface acoustic wave packet and the focused beam width.

Under the same conditions, the focal length h of the system in FIG. 1 is given by the following equation:

$$h = \frac{v_s}{v_1} \frac{f_0}{\Delta f} W \qquad \text{Eqn: 2}$$

where:
$v_s$ = the surface wave velocity along the array 26
$v_1$ = the velocity of the bulk acoustic waves within the solid medium 24
$f_0$ = the center frequency of the chirp pulse Referring to FIG. 3, reference numeral 40 generally indicates an acoustic scanning system comprising two scanning assemblies 14' and 14'' operating in a transmission mode. Both scanning assemblies are positioned with solid-to-solid interfaces around a piece of solid material 42 being investigated. The interfaces between the scanning assemblies are lubricated with grease (not shown) to reduce the transmission loss. The acoustic scanning assembly 14' operates as a transmitter and generates a scanning beam 41 of bulk waves in the same manner as hereinbefore described. The scanning beam penetrates through the solid material 42 and is modulated by it so that any imperfection 44 therein appears in contrast to the remainder of the material.

The scanning assembly 14'' operates as a receiver that accepts the modulated bulk waves and converts these waves into surface acoustic waves for subsequent processing. The receiving assembly 14'' is constructed in the same manner as the scanning assembly 14 illustrated in FIG. 1. The bulk waves propagating in the solid medium 24' in FIG. 3 travel in a reverse direction and diverge onto the perturbation array 26''. The array scatters the bulk waves and converts a portion thereof into surface waves that propagate along the surface of the solid.

It should be appreciated that all of the scanning assemblies and signal processors disclosed in this specification are bi-directional. Each apparatus can accept waves traveling in two directions and, hence, can both transmit and receive acoustic waves.

Figure 3:
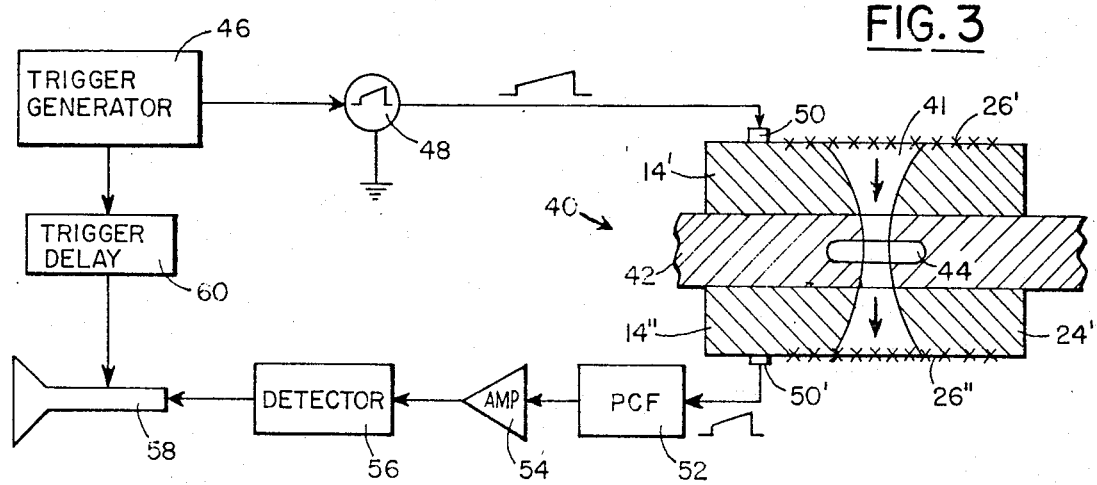
FIG. 3 is a block diagram of an acoustic scanning system operating in a transmission mode and its accompanying circuit according to the present invention.

The acoustic scanning system 40, FIG. 3, further includes a circuit comprising a trigger generator 46 that is connected to a chirp generator 48. The chirp generator produces an output chirp pulse that is passed to a transducer 50 located on the scanning assembly 14'. The transducer converts the chirp pulse into surface acoustic waves that propagate across the scanning assembly. As hereinbefore described, surface waves are scattered by the perturbations and are converted into a downwardly focused, acoustic bulk wave beam 41. The beam converges to a focus having a waist approximately equal in width to the value specified by Eqn. 1. The scanning beam penetrates through the solid material 42 being investigated, is modulated by it, and therefter passes through the receiving acoustic scanner 14″. The bulk waves are converted back into surface acoustic waves by the perturbation array 26″ and then the surface waves are converted into electrical signals by a second transducer 50′. The signal output from the transducer 50′ is a chirp pulse that is passed to a pulse compression filter 52. The pulse compression filter is matched to the chirp generator 48 so as to accept signals having the same chirp slope and pulse width as the input chirp from the chirp generator 48. The output of the pulse compression filter is an analog signal having a time varying amplitude. This signal contains the modulation information describing the imperfection 44 in the solid material 42. The pulse compression filter is connected to a conventional signal amplifier 54 and a detector 56. The detector is connected to an oscilloscope 58 and either modulates the Y axis or the Z axis of the scope. The horizontal sweep of the oscilloscope is triggered by a pulse obtained from the trigger generator 46 and retarded by the trigger delay 60. The trigger delay compensates for the time delay incurred by the acoustic waves passing through the scanning assemblies 14′ and 14″.

Figure 4:
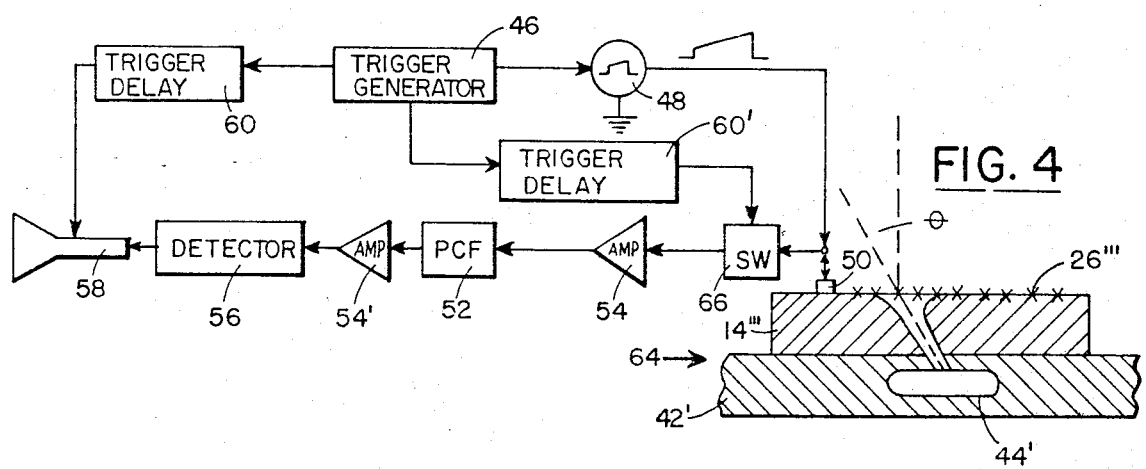
FIG. 4 is a block diagram of another acoustic scanning system operating in a reflection mode and its accompanying circuit according to the present invention.

Referring to FIG. 4, reference numeral 64 generally indicates an acoustic scanning system comprising one scanning assembly 14‴ operating in a reflection mode. The scanning assembly is positioned in direct mechanical contact with a piece of solid material 42′ being investigated. The scanning system is operated by a trigger generator 46 that supplies a starting pulse to a chirp generator 48. The output of the chirp generator is passed to a transducer 50 that converts the chirp pulse into surface propagating acoustic waves. The acoustic surface waves interact with the perturbation array 26‴ and are converted into a downwardly focused, substantially horizontally scanning beam of bulk acoustic waves. The bulk acoustic waves are reflected by any imperfection 44′ in the solid material 42′. In so doing the bulk waves are modulated so that the imperfection 44′ appears in contrast to the remainder of the material. The reflected bulk waves travel upward and are again scattered by the perturbation array 26‴, thereby converting the bulk waves back into surface waves.

As illustrated in FIG. 4, when the length of the chirp pulse is shorter than the surface acoustic wave transit time along the length of the array, for fixed element spacing, the acoustic beam can tilt at an angle $\theta$ by varying the center frequency of the chirp. This angle is measured in the plane formed by the axis of propagation of the surface acoustic waves and an axis normal to the plane of the array. For small angles, in the paraxial case, the angle $\theta$ between the axis of propagation of the bulk wave beam and the normal to the array is given by $$\theta = \frac{V_B}{V_s} \frac{\delta f}{f_o}$$

where $f_o$ is the chirp center frequency for which the beam will be directed normal to the axis of propagation of the surface acoustic wave and $\delta f$ is the change in center frequency required to cause the beam to be directed at an angle $\theta$ to the normal. A positive value of $\delta f$ (i.e. an increase in frequency above $f_o$) leads to a beam tilt in the direction of surface acoustic wave propagation, while a negative $\delta f$ leads to the opposite sense of tilt.

The surface waves in the scanning assembly 14‴, FIG. 4, are converted into electrical signals by the transducer 50 and passed to a conventional semiconductor gate 66. The semiconductor gate or switch is normally shut to prevent the input chirp signal from the generator 48 from driving the signal amplifier 54. The trigger pulse from the trigger generator 46 is delayed by a conventional trigger delay 60′ and opens the switch so that the signals modulated by the object being investigated can pass through the output circuit to the oscilloscope 58. The switch 66 also prevents the input chirp signal from appearing on the output of the oscilloscope. The output of the switch 66 is connected in turn to a signal amplifier 54, a pulse compression filter 52 and a second signal amplifier 54′, and a detector 52. As hereinbefore described, these components are connected either to intensity modulate or to vertically modulate the beam of the oscilloscope 58, FIG. 4. The horizontal sweep of the oscilloscope is triggered by an output pulse obtained from the trigger generator 64 and retarded by a trigger delay 60.

Figure 5:
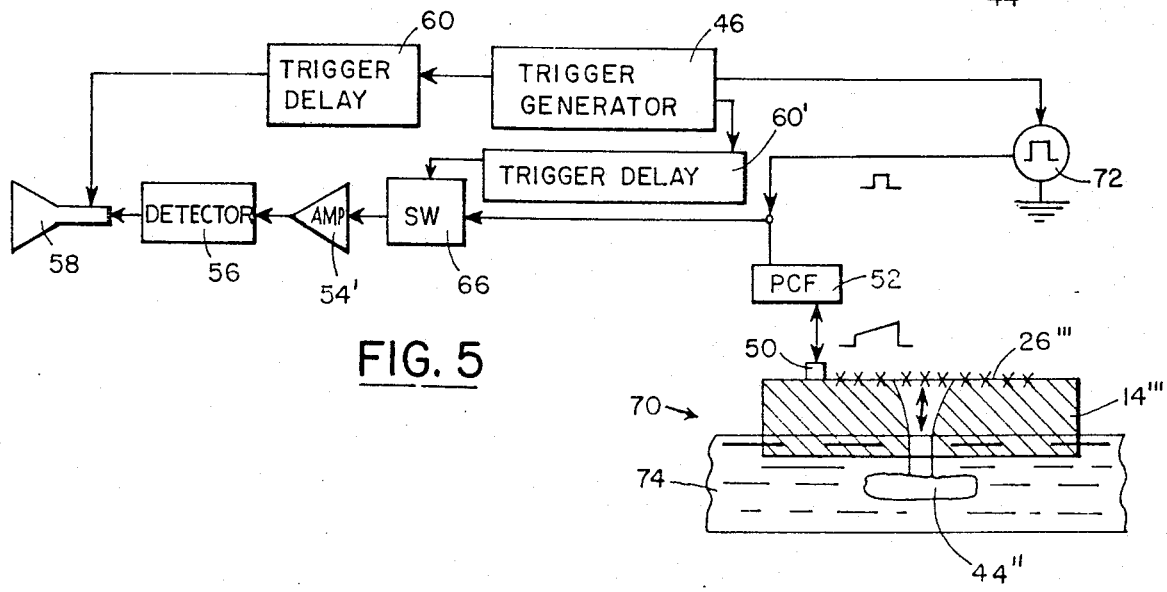
FIG. 5 is a block diagram of a third acoustic scanning system operating in a liquid medium in a reflection mode and its accompanying circuit according to the present invention.

Referring to FIG. 5, reference numeral 70 generally indicates an acoustic scanning system comprising one scanning assembly 14‴ operating in a reflection mode. The object 44″ being investigated is located in a water bath or flowing water column 74. The system is operated by a trigger generator 46 that is connected to a pulse generator 72. The output of the generator is a pulse that is passed to a pulse compression filter 52. The pulse compression filter converts the pulse input into a chirp pulse output. The chirp pulse is converted by the transducer 50 into surface acoustic waves propagating in the scanning assembly. The operation of the scanning assembly 14‴ is exactly analogous to the scanning assemblies hereinbefore described, and, for the purpose of brevity, need not be repeated.

In the scanning assembly, FIG. 5, the modulated surface waves reflected by the object 44″ are converted back into electrical signals by the transducer 50. The output of the transducer 50 is a chirp pulse that is passed in a reverse direction through the pulse compression filter 52. The output of the pulse compression filter is an analog signal having a time varying amplitude. The input circuit to the oscilloscope 58 is protected by a semiconductor switch 66 in the same manner as hereinbefore described. The switch is normally closed and is opened by a pulse from the trigger delay 60′. The output signal from the switch 66 is passed to a signal amplifier 54′ and a detector 56. The output of the detector is passed to the oscilloscope 58 where is either intensity modulates or vertically modulates the visual output of the oscilloscope. The horizontal sweep of the oscilloscope is triggered by an output pulse from the trigger delay 60 connected to the trigger generator 46.

It should be noted that in all of the aforedescribed scanning systems the scanning assemblies ae driven by a chirp signal input and the output from each scanning assembly is also a chirp signal. In some cases, however, this output can be a continuum of superimposed chirp signals. It should be further noted that in each system the output is passed through a pulse compression filter 52. Each pulse compression filter is matched to the associated chirp generator and provides an analog output signal describing the object 42 or the imperfection 44.

Moreover, although in the preferred embodiments the outputs of the systems illustrated in FIGS. 3, 4 and 5 are connected to an oscilloscope, it is contemplated the outputs can also be passed to any other suitable recording apparatus such as a magnetic tape recorder, a plotter or digital computer memory.

Referring to FIG. 6, reference numeral 78 generally indicates an acoustic scanning assembly having an acoustic cylindrical lens 82 fabricated in the bottom surface of the solid medium 24. The scanning assembly is operated by a chirp signal generator 48 connected to a transducer 50 that converts the chirp signal input from the generator into surface propagating acoustic waves. The surface acoustic waves propagate along the top surface of the apparatus and are scattered by the perturbation array 26. The perturbation array converts the surface acoustic waves into a converging beam in the same manner as described in connection with FIG. 1. In the bottom surface of the apparatus 78 in FIG. 6 is located the cylindrical acoustic lens 82 with a cylindrical axis parallel with the direction of propagation of the surface acoustic waves. The lens 82 focuses the converging bulk waves into a small rectangular spot 86. In effect the cylindrical lens brings the sides of the elongate waist 32 in FIG. 1 together into the small rectangle 86, FIG. 6. The rectangular spot scans in a direction substantially parallel to the axis of propagation of the surface waves and at substantially the same velocity.

Referring to FIG. 7, the acoustic scanning assembly 80 incorporates a cylindrical lens in the top surface of the solid medium 24. The surface acoustic waves produced by the transducer 50 propagate down the convex surface 84 that forms the cylindrical lens. The perturbation array 88 consists of a plurality of parallel, spaced apart arcuate grooves machined into the convex surface of the lens. The perturbation array scatters the surface waves into bulk waves in the same manner as hereinbefore described. The combination of the cylindrical lens and the convex perturbation array simultaneously focuses the acoustic waves into the small rectangular spot 86. The rectangular spot or resolution element scans substantially parallel to the direction of propagation of the surface acoustic waves and at substantially the same velocity.

Figure 10:
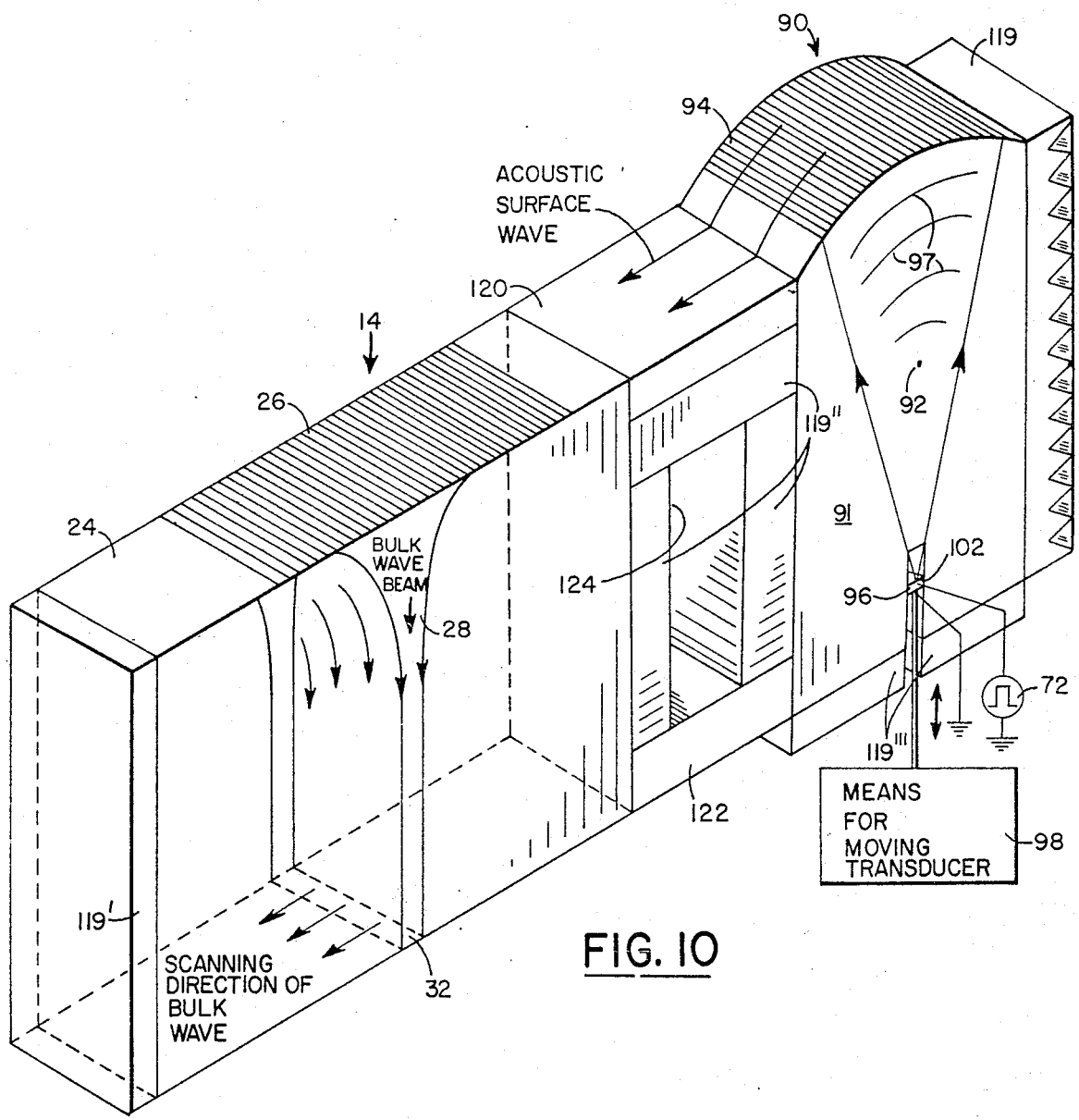
FIG. 10 is a diagrammatic, perspective view of the acoustic scanning apparatus of FIG. 1 in combination with a signal processor for either generating or receiving surface acoustic waves.

Referring to FIG. 10, reference numeral 90 generally indicates an acoustic signal processor that functions as a variable chirp generator when operating in a transmission mode and as a variable pulse compression filter when operating in a receiving mode. The signal processor comprises a solid medium 91 having a cylindrical surface at one end. The cylindrical surface has a center of curvature C located at point 92. In the preferred embodiment the solid medium is fabricated from an aluminum block although any metallic or plastic material having good acoustic wave transmitting characteristics can be used. Machined into the cylindrical surface is a perturbation array 94 comprising a plurality of parallel, spaced apart grooves. The signal processor also includes a bulk wave transducer assembly 96, means for coupling mechanical stress from the transducer to the medium 91, and a means 98 for moving the transducer with respect to the signal processor. The transducer assembly 96 is driven by a pulse generator 72 and produces radially diverging bulk waves inside of the solid medium 91. The location of the transducer is the center of curvature of the acoustic bulk wave fronts 97.

Referring to FIG. 9, the transducer assembly 96 and the means 98 for moving it are shown in greater detail. The assembly includes a PZT bulk wave transducer 102 mounted on top of a hollow shaft 104. The transducer and hollow shaft are elevated and lowered by a micrometer 106 that is held in place by rigid mounting assembly 108. The mounting assembly is bolted to the solid medium 91. The hollow shaft 104 moves in a key way 110 and contains the transducer input leads from the pulse generator 72. The transducer is surrounded by a fluid 112 such as water in order to couple mechanical stress from the transducer to the solid medium. The bellows 114 and the spring assembly 116 maintain the transducer and the walls of the solid medium in constant fluid contact and prevent the formation of bubbles when the transducer is moved. Since the location of transducer 102 controls the location of the center of curvature of the bulk waves produced therefrom, raising and lowering the transducer with the micrometer 106 modifies the curvature of the bulk waves with respect to the curvature of the cylindrical perturbation array.

It should be appreciated that although the transducer 102 is illustrated in FIGS. 9 and 10 as being below the center of curvature 92, it is contemplated within the scope of the invention that the transducer can move along the entire vertical axis of symmetry of the solid medium 91.

To reduce the signal noise created by internal bulk wave reverberations, acoustic absorbers 119, FIG. 10 are rigidly connected to all nonactive surfaces of the device. The absorbers both minimize the reflection of acoustic waves off of the interface between the absorber and the solid media 24 and 91 and also absorb all of the acoustic waves passing across the interfaces from the solid media to the absorbers. The absorbers can be fabricated from any conventional acoustic wave absorbing material, including lead and tungsten-loaded epoxy. Alternatively, the absorbers can be made of the same material as the media 24 and 91, with the absorber surface opposite to the interface containing a plurality of deeply cut, lateral grooves that are filled with a material having a high acoustic wave absorbence such as resin. The resin and the grooves make the absorber surface nonreflective to impinging bulk waves.

Operatively connected to the signal processor 90 is an acoustic scanning assembly 14. This scanning assembly is constructed and operates in the same manner as the assembly illustrated in FIG. 1. The scanning assembly and the signal processor are physically connected by an aluminum bridge 120 fabricated to transmit surface acoustic waves and to block bulk waves. The alignment between the signal processor 90 and the scanning apparatus 14 is maintained by a mechanical support 122 also fabricated from an acoustic bulk wave absorbing material. Located between the bridge 120 and the mechanical support 122 is an air gap 124 that is used to further block the transmission of bulk waves from the signal processor to the scanning apparatus. It should be noted that, in general, all the scanning devices illustrated in FIGS. 1, 3, 4, 5, 6 and 7 would also have acoustic absorbers at all nonactive surfaces.

In operation, the transducer 102 in FIGS. 9 and 10 generates radially diverging bulk waves 97 that are directed toward the cylindrical surface of the solid medium 91. When the bulk waves strike the cylindrical perturbation array 94, the perturbations scatter the waves and convert them from bulk waves into chirped surface acoustic waves. The chirped surface waves then propagate over the cylindrical surface of the processor and across the bridge 120. The surface acoustic waves thereafter propagate along the scanning assembly 14 and are perturbated by the perturbation array 26. The operation of the scanning assembly in FIG. 10 is exactly the same as the operation of the assembly in FIG. 1 hereinbefore described. The bulk acoustic waves 28, FIG. 10, are converged into a line focus 32 that scans substantially in the direction of propagation of the surface acoustic waves in the assembly 14 and at substantially the same speed. This combination of a chirp generator and a scanning apparatus can, for example, replace the chirp generator 48 and the scanning apparatus 14' illustrated in FIG. 3, in the same way that a pulse compression filter 52 in FIG. 5 replaces the chirp generator 48 of FIG. 4.

The production of a chirp signal in the signal processor 90, FIG. 10, can be explained with regard to the diagram in FIG. 8 wherein the cylindrical perturbation array 94 has a center of curvature C at point 92 and a radius R. When a radially diverging bulk wave is generated from a transducer located at point C and irradiates the perturbation array, the bulk waves are scattered into surface acoustic waves traveling in both directions along the cylindrical surface 94. The curvature of the bulk waves matches the curvature of the array. If the transducer is moved vertically upward to point B, then the scattered surface acoustic waves are up-chirped in distance and down-chirped in time. The surface waves are up-chirped in distance in the sense that the instantaneous frequency of the waves increases with distance along their direction of propagation. The surface acoustic waves are down-chirped in time because the instantaneous frequency thereof decreases with time as measured from any fixed point along the cylindrical surface 94. Conversely, if the transducer is moved downward to a point D located below the center of curvature C, then the scattered surface waves are up-chirped in time and down-chirped in distance. Both effects arise because the curvature of the bulk waves does not match the curvature of the perturbation array.

It should be appreciated that by moving the transducer 102 with respect to the center of curvature 92 and thereby varying the distance between the center of origin of the wave fronts and the center of curvature of the perturbation array 94, the signal processor can vary the chirp rate of the resulting surface waves. This feature is of significance in the present invention because when the chirp rate of the surface waves in the scanning assembly 14 is varied, the focal length of the scanning bulk wave beam 28 is correspondingly varied. If a variable focal length is not required in the scanning beam, the bulk wave transducer 102 may be rigidly attached to the bottom surface of medium 91. It will be realized that the bottom surfaces of media 91 and 24 need not lie in the same plane.

Referring to FIG. 10, since the signal processor 90 is capable of bi-directional operation, the signal processor 90 can also be operated as a pulse compression filter. In this case surface acoustic waves from an exterior source (not shown) are propagated along the cylindrical surface of the solid medium 91. The waves are scattered by the perturbation array into radially converging bulk waves. The radially converging waves are received by the transducer 102 having an output signal corresponding to the acoustic waves received from the exterior source after pulse compression filtering.

Alternatively, the top surface of the signal processor 91 in FIG. 10 could be made flat, instead of cylindrical with a finite radius of curvature. In this case, the spacings of the elements in the perturbing array 94 would be made nonuniform, such as to produce a linearly chirped surface acoustic wave. A further component of variation of spacing could be introduced to produce nonlinear chirps when desired. Flat surface processors would not be amenable to variation of chirp slope or focal length by vertical movement of the bulk wave transducer 102.

The signal processor 90 as a pulse compression filter can be operatively connected to an acoustic scanning apparatus 14 operating in a receiving mode as illustrated in FIGS. 3, 4, and 5. The scanning apparatus 14 provides the chirped surface wave input to the processor and the output from the processor is an analog signal corresponding to bulk wave beam received by the scanning apparatus. This combination of a signal processor and a scanning apparatus can, for example, replace the pulse compression filter 52 and the scanning apparatus 14" illustrated in FIG. 3.

It will be appreciated that the pulse compression filter 52 wherever it appears in FIGS. 3, 4 and 5, can be replaced by the signal processor 90 of FIG. 10.

It can be contemplated that under some circumstances the individual elements in the acoustic scattering arrays may be made non-uniform. For example, their scattering strength could be varied as a function of distance along the array, to compensate for attenuation of the surface wave as function of distance.

For highly convergent beams, linear chirp modulation of the surface acoustic waves will not produce an optimum focus. In such cases, a different function of instantaneous frequency versus time, other than linear, could be employed to optimize the focal properties. In cases where signal processors of the type shown in FIG. 10 are employed, non-uniform spacings of the elements in the perturbing arrays could be used to produce such non-linear chirps.

Further, it should be appreciated that the present invention has the capability of being scaled for use throughout the usable acoustic spectrum. The construction, operation, and theory behind the present invention does not limit it to a single operating band.

Thus, although the best mode contemplated for carrying out the present invention has been herein shown and described, it will be apparent that modification and variation may be made without departing from what is regarded to be the subject matter of the invention.

What is claimed is:

1. Apparatus for generating focused acoustic bulk waves, comprising:
   a. means for generating a chirp pulse output;
   b. a solid medium for transmitting acoustic waves;
   c. an array of perturbations located on one surface of the solid medium; and
   d. transducer means operatively connected to the generating means and the solid medium for converting the chirp pulse from the generating means into surface acoustic waves propagating along the perturbation array surface of the solid medium, said surface acoustic waves being inwardly scattered into the solid medium by said perturbation array and converged into a focused beam of acoustic bulk waves angularly directed from the direction of propagation of the surface acoustic waves.

2. The apparatus of claim 1 wherein the array of perturbations includes a uniformly spaced apart plurality of parallel grooves having a spacing distance substantially equal to the wavelength of the center frequency of the chirp pulse.

3. The apparatus of claim 1 wherein the array of perturbations includes a uniformly spaced apart plurality of parallel strips disposed on the surface of the solid medium and having a spacing distance substantially equal to the wavelength of the center frequency of the chirp pulse.

4. The apparatus of claim 1 wherein the array of perturbations includes a plurality of parallel grooves having nonuniform spacing.

5. The apparatus of claim 1 wherein the array of perturbations includes a plurality of parallel strips having nonuniform spacing.

6. The apparatus of claim 1 wherein the array of perturbations includes a plurality of parallel grooves having nonuniform depth.

7. The apparatus of claim 1 wherein the array of perturbations includes a plurality of parallel grooves having nonuniform width.

8. The apparatus of claim 1 wherein the array of perturbations includes a plurality of parallel grooves having a spacing distance substantially equal to an integral multiple of the wavelength of the center frequency of the chirp pulse.

9. The apparatus of claim 1 wherein the array of perturbations includes a plurality of parallel strips having a spacing distance substantially equal to an integral multiple of the wavelength of the center frequency of the chirp pulse.

10. The apparatus of claim 1 wherein the bulk wave beam is perpendicularly directed from the direction of propagation of the surface acoustic waves.

11. The apparatus of claim 1 wherein the array of perturbations includes a plurality of parallel strips having nonuniform thickness.

12. The apparatus of claim 1 wherein the array of perturbations includes a plurality of parallel strips having nonuniform width.

13. The apparatus of claim 1 wherein the chirp pulse generating means includes a pulse signal generator and pulse compression filter means connected thereto and having a chirp pulse output.

14. Apparatus for converting focused acoustic bulk waves from an exterior source into an electrical output signal, comprising:
   a. a solid medium for receiving acoustic bulk waves diverging from a focus of such waves;
   b. an array of perturbations located on one surface of the solid medium such that the diverging acoustic bulk waves received by the solid medium are incident on said array and are scattered thereby into surface acoustic waves propagating along the surface of the solid medium;
   c. transducer means operatively connected to the solid medium for converting the surface acoustic waves propagating along the surface of the solid medium into an output chirp signal; and
   d. pulse compression filter means connected to said transducer means for converting the output chirp signal obtained from the scattered acoustic waves into an electrical output signal.

15. The apparatus of claim 14 wherein the array of perturbations includes a uniformly spaced apart plurality of parallel grooves having a spacing distance substantially equal to the wavelength of the center frequency of the chirp signal.

16. The apparatus of claim 14 wherein the array of perturbations includes a uniformly spaced apart plurality of parallel strips disposed on the surface of the solid medium and having a spacing distance substantially equal to the wavelength of the center frequency of the chirp signal.

17. The apparatus of claim 14 wherein the array of perturbations includes a plurality of parallel grooves having nonuniform spacing.

18. The apparatus of claim 14 wherein the array of perturbations includes a plurality of parallel strips having nonuniform spacing.

19. The apparatus of claim 14 wherein the array of perturbations includes a plurality of parallel grooves having nonuniform depth.

20. The apparatus of claim 14 wherein the array of perturbations includes a plurality of parallel grooves having nonuniform width.

21. The apparatus of claim 14 wherein the array of perturbations includes a plurality of parallel grooves having a spacing distance substantially equal to an integral multiple of the wavelength of the center frequency of the chirp pulse.

22. The apparatus of claim 14 wherein the array of perturbations includes a plurality of parallel strips having a spacing distance substantially equal to an integral multiple of the wavelength of the center frequency of the chirp pulse.

23. The apparatus of claim 14 wherein the bulk wave beam is perpendicularly directed from the direction of propagation of the surface acoustic waves.

24. The apparatus of claim 14 wherein the array of perturbations includes a plurality of parallel strips having nonuniform thickness.

25. The apparatus of claim 14 wherein the array of perturbations includes a plurality of parallel strips having nonuniform width.

26. Method of generating focused acoustic bulk waves, comprising the steps of:
   a. generating a chirp pulse with a signal generator;
   b. converting the chirp pulse into surface acoustic waves propagating in a solid material; and
   c. converging acoustic bulk waves into a focused beam by scattering the surface acoustic waves with an array of perturbations located on the solid material and in the path of propagation of the surface acoustic waves.

27. The method of claim 26 further including the step of dimensioning the array of perturbations so as to have a spacing distance substantially equal to an integral multiple of the wavelength of the center frequency of the chirp pulse.

28. Method for converting focused acoustic bulk waves from an interior or exterior source into an electrical output signal, comprising the steps of:
   a. receiving in a solid medium acoustic bulk waves diverging from an interior or exterior focus of such waves;
   b. scattering the diverging acoustic bulk waves into surface acoustic waves with an array of perturbations located on one surface of the solid medium;
   c. converting the surface acoustic waves into an output chirp signal; and
   d. pulse compression filtering said chirp signal obtained from the scattered acoustic waves into an electrical output signal.

29. The method of claim 28 further including the step of dimensioning the array of perturbations so as to have a spacing distance substantially equal to an integral multiple of the wavelength of the center frequency of the chirp pulse.

30. Apparatus for generating focused acoustic bulk waves, comprising:
   a. means for generating a chirp pulse output;
   b. a solid medium for transmitting acoustic waves;
   c. an array of perturbations located on one surface of the solid medium;
   d. transducer means operatively connected to the generating means and the solid medium for converting the chirp pulse from the generating means into surface acoustic waves propagating along the perturbation array surface of the solid medium, said surface acoustic waves being inwardly scattered into the solid medium by said perturbation array and also converged toward a first plane located normal to the direction of propagation of the surface acoustic waves and angularly directed therefrom; and
   e. means forming an acoustic lens operatively connected to said solid medium, said lens focusing the converging beam of acoustic bulk waves scattered by the array of perturbations toward a second plane located normal to said first plane and parallel to the direction of propagation of the surface acoustic waves.

31. The apparatus of claim 20 wherein the acoustic lens is a cylindrical lens formed in a surface of the solid medium and having an axis of symmetry parallel to the direction of propagation of the surface acoustic waves.

32. The apparatus of claim 31 wherein the cylindrical lens is formed in a surface of the solid medium opposite to the surface wherein the surface acoustic waves propagate.

33. The apparatus of claim 31 wherein the cylindrical lens is formed in the same surface of the solid medium wherein the surface acoustic waves propagate.

34. Apparatus for scanning an object with focused acoustic bulk waves and for recording the acoustic image of the object, comprising:
   a. means for generating a chirp pulse output;
   b. a solid medium for transmitting acoustic waves;
   c. an array of perturbations located on one surface of the transmitting medium;
   d. transducer means operatively connected to the generating means and the transmitting medium for converting the chirp pulse from the generating means into surface acoustic waves propagating along the perturbation array surface of the transmitting medium, said surface acoustic waves being inwardly scattered into the transmitting medium by said perturbation array and converged into a focused beam of acoustic bulk waves angularly directed from the direction of propagation of the surface acoustic waves, said acoustic bulk waves being brought to a focus within the object and scanned across said object at substantially the same velocity as the surface acoustic waves and thereby modulated by the object;
   e. a solid medium for receiving the acoustic bulk waves modulated by the object;
   f. an array of perturbations located on one surface of the receiving medium such that the acoustic bulk waves received by the receiving medium are incident on said array and are scattered thereby into surface acoustic waves propagating along the surface of the receiving medium;
   g. transducer means operatively connected to the receiving medium for converting the surface acoustic waves propagating along the surface of the receiving medium into an output chirp signal;
   h. pulse compression filter means connected to said transducer means for converting the output chirp signal therefore into an electrical output signal; and
   i. means connected to the pulse compression filter means for recording the electrical output signal therefrom and thereby the acoustic image of the object.

35. The apparatus of claim 34 wherein the solid medium for transmitting acoustic waves includes the solid medium for receiving acoustic waves and wherein the object is imaged by reflecting acoustic bulk waves therefrom.

36. The apparatus of claim 34 wherein the recording means includes an oscilloscope for visually recording the analog signal from the pulse compression filter means and further including timing means for sequencing the chirp generating means and the oscilloscope.

37. Apparatus for generating acoustic chirp signals, comprising:
   a. a solid medium for transmitting acoustic waves and having a cylindrical surface at one end thereof, said cylindrical surface having a center of curvature located within said transmitting medium;
   b. transducer means for generating radially diverging acoustic bulk waves within the transmitting medium that are directed toward the cylindrical surface, said transducer means being located proximate to the transmitting medium; and
   c. an array of perturbations located on the cylindrical surface of the transmitting medium and positioned in the path of propagation of the radially diverging acoustic bulk waves so as to scatter said acoustic bulk waves into surface acoustic waves, said surface acoustic waves propagate along the cylindrical surface of the transmitting medium thereby generating acoustic chirp signals.

38. The apparatus of claim 37 further including means for moving said transducer means with respect to the center of curvature of the cylindrical surface such that acoustic signals having a variable chirp rate are generated.

39. The apparatus of claim 37 further including means for reducing internal reflections of the acoustic bulk waves within the transmitting medium.

40. The apparatus of claim 37 further including:
   a. a second solid medium for transmitting acoustic waves operatively connected to the transmitting medium having the cylindrical surface, said second transmitting medium having a propagating surface in acoustic surface wave communication with the cylindrical surface of the transmitting medium such that chirp signals generated by said transmitting medium are passed to the propagating surface; and
   b. a second array of perturbations located on the propagating surface of the second transmitting medium for scattering the acoustic surface waves propagating therein, said surface acoustic waves scattered by said perturbation array being inwardly focused thereby into a beam of acoustic bulk waves angularly directed from the direction of propagation of the surface acoustic waves.

41. Method of generating variable acoustic chirp signals; comprising the steps of:

a. transmitting radially diverging acoustic bulk waves in a transmitting medium using a transducer located proximate thereto, said waves being directed toward a cylindrical surface located at one end of the transmitting medium and having a center of curvature located within the transmitting medium;

b. scattering said radially diverging acoustic bulk waves into surface acoustic waves propagating through the cylindrical surface using an array of perturbations located on said cylindrical surface; and c. moving said transducer with respect to the center of curvature of the cylindrical surface such that variable acoustic chirp signals are generated.

42. Apparatus for generating acoustic chirp signals; comprising:

a. a solid medium for transmitting acoustic waves and having a substantially flat surface at one end thereof;

b. transducer means for generating radially diverging acoustic bulk waves within the transmitting medium that are directed toward the substantially flat surface, said transducer means being located proximate to the transmitting medium; and c. an array of nonuniform perturbations located on the substantially flat surface of the transmitting medium and positioned in the path of propagation of the radially diverging acoustic bulk waves so as to scatter said acoustic bulk waves into surface acoustic waves, said surface acoustic waves propagate along said flat surface of the transmitting medium thereby generating acoustic chirp signals 43. The apparatus of claim 42 wherein the perturbations located on the substantially flat surface are spaced to produce linearly chirped surface acoustic waves.

44. The apparatus of claim 42 further including:

a. a second solid medium for transmitting acoustic waves operatively connected to the transmitting medium having the substantially flat surface, said second transmitting medium having a propagating surface in acoustic surface wave communication with said flat surface of the transmitting medium such that chirp signals generated by said transmitting medium are passed to the propagating surface; and b. a second array of perturbations located on the propagating surface of the second transmitting medium for scattering the acoustic surface waves propagating therein, said surface acoustic waves being inwardly scattered by said perturbation array and converged into a focused beam of acoustic bulk waves angularly directed from the direction of propagation of the surface acoustic waves.

45. Apparatus for pulse compression filtering acoustic surface waves received from an exterior source, comprising:

a. a solid medium for transmitting acoustic bulk waves and having a cylindrical surface at one end thereof, said cylindrical surface having a center of curvature located within the transmitting medium and forming a propagation surface for acoustic surface waves received from the exterior source;

b. an array of perturbations located on the cylindrical surface and positioned in the path of the acoustic surface waves received from the exterior source so as to scatter said acoustic surface waves into radially converging acoustic bulk waves; and c. transducer means located proximate to the transmitting medium for receiving the radially converging acoustic bulk waves and having an output signal corresponding to the acoustic surface waves received from the exterior source after pulse compression filtering.

46. The apparatus of claim 45 further including means for moving said transducer means with respect to the center of curvature of the cylindrical surface such that output signals having variable pulse compression filtering are generated.

47. The apparatus of claim 45 further including:

a. a second solid medium for receiving acoustic bulk waves from an exterior source operatively connected to the transmitting medium, said second medium having a propagating surface in acoustic surface wave communication with the cylindrical surface of the transmitting medium such that acoustic surface waves from the second receiving medium are passed to the cylindrical propagating surface; and b. a second array of perturbations located on the propagating surface of the second receiving medium such that the acoustic bulk waves received by the second medium are incident on said array and are scattered thereby into surface acoustic waves propagating along the surface of said second receiving medium.

48. Method of variable pulse compression filtering acoustic surface waves received from an exterior source, comprising the steps of:

a. receiving acoustic surface waves from the exterior source on a cylindrical propagating surface of a solid medium;

b. scattering the acoustic surface waves into radially converging acoustic bulk waves using an array of perturbations located on the cylindrical propagating surface;

c. receiving the acoustic bulk waves with a transducer, and d. moving the transducer with respect to the cylindrical propagating surface such that output signals having variable pulse compression filtering are obtained from the transducer.

49. Apparatus for pulse compression filtering acoustic surface waves received from an exterior source, comprising:

a. a solid medium for transmitting acoustic bulk waves and having a substantially flat surface at one end thereof, said flat surface forming a propagation surface for acoustic surface waves received from the exterior source;

b. an array of nonuniform perturbations located on the substantially flat surface and positioned in the path of the acoustic surface waves received from the exterior source so as to scatter said acoustic surface waves into radially converging acoustic bulk waves; and c. transducer means located proximate to the transmitting medium for receiving the radially converging acoustic bulk waves and having an output signal corresponding to the acoustic surface waves received from the exterior source after pulse compression filtering.

50. The apparatus of claim 49 further including:

a. a second solid medium for receiving acoustic bulk waves from an exterior source operatively connected to the transmitting medium, said second medium having a propagating surface in acoustic surface wave communication with the substantially flat surface of the transmitting medium such that acoustic surface waves from the second receiving medium are passed to the flat propagating surface; and b. a second array of perturbations located on the propagating surface of the second receiving medium such that the acoustic bulk waves received by the second medium are incident on said array and are scattered thereby into surface acoustic waves propagating along the surface of said second receiving medium.

* * * * *